United States Patent [19]
Sato et al.

[11] Patent Number: 6,144,706
[45] Date of Patent: Nov. 7, 2000

[54] DISTORTION COMPENSATION CIRCUIT

[75] Inventors: Yuzo Sato; Yasushi Saito; Hiroki Nishizono, all of Saitama, Japan

[73] Assignee: Yagi Antenna Co., Ltd., Tokyo, Japan

[21] Appl. No.: 09/173,761

[22] Filed: Oct. 16, 1998

[51] Int. Cl.[7] .............................. H04K 1/02; H04L 25/03; H04L 25/49
[52] U.S. Cl. .......................... 375/296; 327/317; 359/337
[58] Field of Search ..................... 375/346, 349, 375/296, 295, 211, 214, 284, 297; 359/153, 174, 180, 249, 333, 337

[56] References Cited

U.S. PATENT DOCUMENTS

| | | | |
|---|---|---|---|
| 4,109,212 | 8/1978 | Donnell et al. | 327/317 |
| 5,132,639 | 7/1992 | Blauvelt et al. | 330/149 |
| 5,282,072 | 1/1994 | Nazarathy et al. | 359/157 |
| 5,600,472 | 2/1997 | Uesaka | 359/161 |
| 5,675,613 | 10/1997 | Uwano et al. | 375/346 |
| 5,939,920 | 8/1999 | Hiraizumi | 327/306 |

*Primary Examiner*—Stephen Chin
*Assistant Examiner*—Lenny Jiang
*Attorney, Agent, or Firm*—Sughrue, Mion, Zinn Macpeak & Seas, PLLC

[57] ABSTRACT

To obtain a uniform improving effect of secondary distortion over a wide frequency band with a very simple configuration and less power consumption in the distortion compensation circuit, that improves the secondary distortion circuit of an optical transmitter and a high-frequency amplifier used for a transmission line processing a high-frequency signal over a wide frequency band, such as a cable television(CATV). A fundamental passing path for passing a fundamental wave is configured by connecting an attenuation component 102 for attenuating a signal, comprising a combination of resistors in series with a delay line 103, and a distortion adding path to add distortion is configured by connecting a 1st attenuation component 104 for attenuating a signal comprising a resistor, a 1st diode 105 and a 2nd diode 106 for generating distortion in series and connecting a 2nd delay element 107 and a 2nd attenuation element 108 for setting a signal level and comprising a resistor is series between a connecting point Q of the 1st diode 105 and the 2nd diode 106 and an output terminal 109.

3 Claims, 7 Drawing Sheets

DISTORTION COMPENSATION CIRCUIT

BACKGROUND OF THE INVENTION

The present invention relates to a distortion compensation circuit for improving secondary distortion characteristics in an optical transmitter and a high-frequency amplifier used in a transmission path for a broadband high-frequency signal such as a cable television (CATV) etc.

In the initial CATV system, all of the transmission lines from a head end to respective subscriber's terminals are formed by coaxial lines. Further, in order to compensate signal loss of the lines, amplifiers are provided usually with an interval of about 500 m, that is, an interval of about 20 dB of line loss, whereby the signal is transmitted such that it is repeatedly and alternately attenuated and amplified.

The number of stages of the amplifiers connected in series in this CATV transmission line differs depending on the scale of the facility and the loss performance of the cable to be used, and becomes thirty (30) or more when used in a large scale facility. In this case, the signal is added with noise and distortion component each time passing through an amplifier and hence the quality of the signal degraded gradually.

In such a CATV system, the signal reached a subscriber's terminal after passing through maximum number of amplifiers in the CATV facility is required to satisfy the signal quality condition defined by the technical standard of the rules of the cable television broadcast law, for example. Further, the efficiency of the amplifier etc. should be determined and distributed so as to at least satisfy such a condition.

Although the signal quality of the CATV is legally regulated in this manner, it can not be concluded that the efficiency of the facility is sufficient so long as such a condition is satisfied. This is because there is a background that the technical standard was determined based on the signal quality required in facilities at which it is intended to eliminate such a problem by using cables that the facilities exist in areas with poor signal reception such as places among mountains where high-quality signal reception can not be. Further, this is because the signal fault caused by noise and distortion component is liable to be detected more easily due to the fact that recently the screen size of television receivers has been increased and the quality of image of video appliances has been improved.

In view of the aforesaid circumstances, the signal quality required in the actual CATV facilities is higher than the legally regulated value. The degree of such signal quality has been presented in the form of the conferences and recommendations of the industrial associations etc. and in the form of the individual required standards of the respective CATV corporations, and the contents of the required quality has been increased year after year. This fact means that, in the case of a facility using only coaxial lines, the number of stages of amplifiers can not be increased to a large number and hence the scale of the facility is limited.

As a means for eliminating the limitation of the scale of such a CATV facility using only coaxial lines, the hybrid fiber coaxial (HFC) system has been recently put to practical use.

In the HFC system, all-channel high-frequency signals to be transmitted are transmitted from an optical transmitter (E/O) in a head end to an optical receiver (O/E) through an optical fiber, then the signals are converted into the high-frequency signals by the optical receiver and distributed to subscribers through coaxial lines.

This HFC system is able to transmit signals over the distance of about 20 km at maximum between the E/O and the O/E without using any repeater but through an optical fiber line which is substantially lower in loss as compared with a coaxial line. Thus, it is possible to provide a CATV facility having a scale sufficient for covering the entire area of a single city, for example, by laying a plurality of optical lines therein. Such a distance corresponds to 40 stages of serially connected amplifiers of the coaxial system. If such a CATV facility is formed only by coaxial lines, the signals will be degraded to no practical degree. In the HFC system, the number of stages of amplifiers constituting the coaxial system at the succeeding stage of the O/E is usually limited to about 6 so that the degradation of signal quality is suppressed at this portion.

In order to operate the HFC system effectively, the efficiency of the optical transmission system thereof is required to be better than that of the coaxial transmission system formed by several ten stages of amplifiers for transmitting a signal over a distance equal to that of the optical transmission system.

The factors for determining the quality of the CATV transmission system are a carrier to noise ratio (C/N) and distortion characteristics. The distortion characteristics is classified into secondary distortion component and third order distortion component respectively defined as composite second order (CSO) distortion and composite third order distortion (composite triple beat: CTB). The reason for calling such distortions in this manner is as follows. That is, since the carriers of the television signals are disposed with an equal interval of 6 MHz on the frequency axis, the distortion components dropped into the frequencies obtained through the addition and subtraction of the frequencies of the respective carriers appear intensively at the frequencies which exist with almost constant interval from the respective carriers despite that the distortion components accompany the frequency deviations of the respective channels (allowable deviation under regulations is within 20 kHz). Thus, the distortion components appear as composite of many distortions slightly differing in frequencies. Such distortions are detected as beat of striped pattern on a screen.

Other fault caused by the third order distortion is a fault called as cross modulation in which the modulation contents of other channel overlaps on a screen. In a CATV facility having transmission channels about more than 20 channels, that is, in most CATV facilities, the aforesaid composite beat fault appears mainly and the cross modulation is negligible. This is because, although the degree of the cross modulation increases simply in proportional to the channel number, the degree of the CTB increases almost in proportional to the number of the combinations employing 3 from the channel number n, that is, nC3.

Among the aforesaid factors for determining the quality of the CATV transmission system, the optical transmission path can easily exceed in the C/N and CTB characteristics than the coaxial transmission path when the lengths of both the paths are same, in particular, due to the recent improvement of the efficiency of the laser diode (LD) used as an optical source of the optical transmitter.

However, the efficiency of the optical transmission path is almost same in the CSO of the secondary distortion as that of the coaxial line having the same length as that of the optical transmission path. As a matter of course, the C/N characteristics and the distortion characteristics are in an opposite relation, that is, when the modulation degree is made larger, the C/N characteristics can be improved but the distortion characteristics is degraded. When the C/N characteristics and the CTB characteristics are determined at the compromise point therebetween, the CSO becomes insufficient level. In contrast, when the CSO and the CTB characteristics are determined at the compromise point therebetween, the C/N characteristics becomes insufficient level.

This fact derives from the nature of the LD. In the case of the high-frequency amplifier constituting the coaxial system, the secondary distortion component can be easily suppressed by forming the circuit arrangement in a push-pull type. In contrast, in the case of the LD, such an operation can not be expected and the secondary distortion with a higher level than the third order distortion will be generated.

Although the optical transmission path is superior than the arrangement of the all coaxial line when the lengths of both the paths are the same, the HFC type is not sufficient in the signal quality due to the bad secondary distortion characteristics peculiar to the LD. The HFC type would be able to provide high grade service to subscribers if such a problem is obviated.

The predistortion method has been proposed as a means for improving such distortion characteristics. This method makes the entire operation linear thereby to cancel the distortion component by adding, at the pre-stage of an element having non-linear characteristics such as an LD etc., a circuit having non-linear characteristics reverse to that of the element.

FIG. 2 is a block diagram showing the configuration of a conventional distortion compensation circuit. U.S. Pat. No. 5,132,639 (issued on Jul. 21, 1992) is raised as the conventional example and the operation thereof will be explained with reference to FIG. 2 (FIG. 1 in the U.S. patent).

The distortion of reverse characteristics is added between a high-frequency signal input 12 and a terminal 25 to a transmission device. A light emitting diode (LED) or a semiconductor laser, that is, a laser diode (LD) is mentioned as the transmission device, but none is shown in figures.

The electric power of the high-frequency signal applied to the high-frequency signal input 12 is partially branched into a path 14 by a directional coupler 10 and sent to a distortion generation unit 15. The distortion generation unit 15 generates the secondary distortion or more higher order distortion (this U.S. patent intends also to cancel the third order distortion). The distortion component thus generated is passed through an amplitude adjusting unit 17, a frequency tilt adjusting unit 19 and a phase adjusting unit 21, then applied as a distorted signal 22 to a directional coupler 11, in which the distorted signal is mixed with a delayed modulation signal 24 which is subjected to only time delay without being distorted. In this case, a ratio of the amplitude of the distortion component relative to that of the modulation signal and the phase relation therebetween are adjusted so as to be reverse to those of the distortion characteristics of a laser diode connected to the rear stage of the directional coupler 11.

The high-frequency signal partially branched into the other path 13 by the directional coupler 10 is delayed by a delay time adjusting unit 23 by a time corresponding to the delay time of the distortion generation unit 15 side having a longer transmission path than the delay time adjusting unit 23 side. Then, the output signal of the delay time adjusting unit 23 is supplied to the directional coupler 11 as the delayed modulation signal.

Explanation has been made as to the configuration and the operation theory of the conventional distortion compensation circuit. The conventional distortion compensation circuit has a problem that the uniform distortion canceling condition can not be attained as to all the signals distributed in a wide frequency band. This is because the conventional distortion compensation circuit employs many high-frequency transformers as the constituent elements thereof. Further, such a problem has become more difficult to obviate since the frequency band of the CATV has expanded from the conventional lower limit of 70 MHz and upper limit of about 300 MHz to the upper limit of 450 MHz, and recently to the upper limit of 750 or 800 MHz and so the number of channels have been increased.

FIG. 3 is a vector diagram for explaining the required characteristics of a distortion compensation circuit. Supposing that the reverse distortion component having the same amplitude as the distortion generated by a laser diode can be generated and supplied to the laser diode, allowable amounts of phase error or delay time error of the reverse distortion component will be obtained as follows in accordance with FIG. 3.

A vector OA is one representing the distortion component generated by a laser diode. A vector for completely canceling the distortion component is one denoted by OAbar (Abar represents a reversed sign of A and a horizontal line is added thereto in FIG. 3) having the same amplitude as the vector OA and having a phase deviated by 180 degrees therefrom.

An allowable angle deviation θ of a vector OB with respect to the vector OA will be calculated under a condition that the required improvement factor of the distortion is 10 dB and the vector OB is same in amplitude as the vector OA and the phase difference thereof from the vector OA is not accurately 180 degrees. The improvement factor of 10 dB means that the magnitude of the cancellation remaining vector resulted from the addition of the vectors OA and OB is $1/\sqrt{10}$ times, that is, about 0.316 times as large as the magnitude of the vector OA or OB.

That is, supposing that the magnitude of the distortion component OA is 1.0, the magnitude of the reverse distortion component OB is 1.0 and the magnitude of the cancellation remaining vector OP is $1/\sqrt{10}=0.316$.

The magnitude of the angle θ is obtained as follows under such a condition.

$$\theta=180 \text{ degrees}-2\times\arccos\{1/(2\times\sqrt{10})\}\approx18.2 \text{ degrees}.$$

In other words, the vector of the reverse distortion component vector is required to be held within 180 degrees±18.2 degrees with respect to the distortion component. This allowable limit angle is represented as follows as an allowable time difference Δt at 800 MHz which is considered as the upper limit frequency of the current CATV system.

$$\Delta t=\{1/(800\times10^6)\}\times(18.2 \text{ degrees}/360 \text{ degrees})[\text{seconds}]=63.2[\text{picoseconds}]$$

That is, in order to maintain the distortion improvement factor of 10 dB at the frequency band of 800 MHz, the delay time deviation of the circuit is required be within ±63.2 picoseconds. The allowable time difference thus obtained is a value at the upper limit frequency of the frequency band. The allowable time difference is considered to be larger in inverse proportional to the frequency in the lower frequency range when the allowable limit angle is same.

However, in the case where, for example, two signals of about 400 MHz are added in their frequencies due to the secondary distortion and drops as the distortion around 800 MHz, the phase differences of these two signals will be added. That is, the angle difference almost half of the aforesaid allowable angle deviation of ±18.2 degrees is allowed.

In other words, the delay time difference determined by the upper limit of the frequency band must be maintained over the entire range of the frequency band. In view of the aforesaid nature of the allowable phase difference or the allowable delay time difference, it will be understood that the presence of a high-frequency transformer results in a main cause of the error. In the arrangement of the conventional distortion compensation circuit shown in FIG. 2, each of the directional couplers 10, 11, distortion generation unit 15 etc. includes as a constituent element a high-frequency transformer which is formed by winding wires around a core formed by ferrite.

FIG. 4 is a measured example showing the delay time characteristics between the input and the output of the directional coupler 10 disposed between the high-frequency signal input 12 and the output 13 of the conventional distortion compensation circuit in FIG. 2. In FIG. 4, the frequency is plotted on the ordinate from 0 MHz at the left end to 1000 MHz at the right end in a manner that one scale represents 100 MHz, while the delay time is plotted on the abscissa in a manner that one scale represents 100 picoseconds. The "∇" shaped sign on the plotted curve is a maker representing 800 MHz which is set to be the center or reference point on the abscissa.

This relation of both the ordinate and the abscissa is common to the respective figures (FIGS. 5 and 6) showing the following measured data. The example of FIG. 4 exhibits the substantially flat delay time characteristics between 70 to 800 MHz in the CATV frequency band and the delay time deviation is kept within the aforesaid required value of ±63.2 picoseconds.

FIG. 5 is a measured example showing the delay time characteristics between the input terminal and the branched terminal of the directional coupler 10 disposed between the high-frequency signal input 12 and the branched output 14 of the conventional distortion compensation circuit in FIG. 2.

In FIG. 5, the delay time varies by about 100 picoseconds at maximum between 70 MHz and 800 MHz. Although each of the delay time characteristics shown in FIGS. 4 and 5 relates to the single directional coupler 10, the arrangement of the conventional distortion compensation circuit includes the directional coupler 11 similar to the directional coupler 10 at the signal output side.

Supposing that another directional coupler having the same characteristics as the directional coupler 10 is employed as the directional coupler 11 such that it is disposed in reverse direction with respect to the directional coupler 10, there will be the delay time variation with respect to the frequency like FIG. 5 between the branched terminal 22 and the output 25 and hence the total delay time variation will be about 200 picoseconds. This total delay time variation largely exceeds the aforesaid required delay time variation range of ±63.2 picoseconds. 200 picoseconds corresponds to the phase difference of about 60 degrees at the frequency of 800 MHz. If this phase difference is applied to the angle θ of the vector diagram shown in FIG. 3, the respective vectors OA, OP, OB form the respective sides of an equilateral triangle, so that the lengths of these vectors become same, which means that the no cancellation of the distortion will be made.

FIG. 6 is a measured example showing the delay time characteristics of a 180 degree splitter 30 shown in FIG. 7 (corresponding to FIG. 2 of U.S. Pat. No. 5,132,639) which is an example of the distortion generation unit 15 of the conventional compensation circuit of FIG. 2.

This is a high-frequency transformer for performing, in brief, unbalanced state to balanced state conversion, which generates the balanced state in which both electrodes have positive and negative voltages symmetrical with respect to the ground from the unbalanced input in which one electrode is always grounded and so at a zero voltage. Since the measuring system is the unbalanced state, this data is obtained by connecting two transformers of the same condition so as to oppose their balanced side to each other thereby to perform the unbalanced state—balanced state—unbalanced state conversion. Accordingly, half of the measured value becomes the delay time characteristics of a single transformer. The measured variation of the delay time characteristics is about 160 picoseconds for two transformers and about 80 picoseconds for one transformer in the frequency range of 70 MHz to 800 MHz, and further surges in a wave shape periodically with respect to the frequency.

As clear from the aforesaid description, according to the configuration of the conventional distortion compensation circuit, the circuit system for adding the distortion contains at least the two directional couplers 10, 11 and the high-frequency transformer in the distortion generation unit 15. The accumulated amount of the variation of the delay time of such constituent elements largely exceeds the allowable variation of the delay time discussed above.

Of course, the conventional arrangement shown in FIG. 2 includes portions for adjusting the amplitude, frequency tilt and phase, and so it is considered that these factors can be corrected when they change monotonously with respect to the frequency. However, it is impossible to correct such factors within the actual circuit scale in the case where the changes occur in a narrow frequency range periodically like the delay time characteristics. Further, since it is clear that the amplitude, frequency tilt and phase can not be controlled independently without influencing on remaining ones of these factors, it is actually impossible to adjust the amplitude as well as the phase so as to be reverse to the distortion characteristics of the LD appearing in a wide frequency band.

Accordingly, although the conventional distortion compensation circuit arrangement can be operated so as to improve the distortion characteristics at a particular frequency portion, the conventional distortion compensation circuit has a drawback that the improvement of the distortion characteristics can be scarcely obtained or the distortion characteristics is degraded at other frequency portion.

Further, the high-frequency transformer is usually formed by winding for several turns a wire with a diameter of about 0.1 to 0.3 mm, whose surface is subjected to insulation processing, around a core material having holes with a diameter of about 1 mm. Thus, the high-frequency transformer has a problem that, since the delay time characteristics thereof changes slightly depending on the piled order of the wire which can not be controlled and the degree of slack of the piled wire, the adjustment of the delay time characteristics can not be expected to be realized with good reproducibility.

Furthermore, the conventional distortion compensation circuit includes many variable resistors and variable capacitors intended to separately control amplitude, phase or the like in addition to many high-frequency transformers and further includes amplifiers (32, 33 in FIG. 7) as parts for generating distortion. Therefore, the conventional distortion compensation circuit has a problem that the circuit arrangement is complicated, large electric power is consumed, adjustment takes a long time and so the cost is expensive.

SUMMARY OF THE INVENTION

In order to obviate the aforesaid problem, the present invention intends to provide a distortion compensation circuit capable of improving secondary distortion characteristics uniformly over a wide frequency band with quite simplified configuration and small power consumption.

In order to achieve the aforesaid object, the distortion compensation circuit according to the present invention comprises: a fundamental wave passing path for passing a fundamental wave therethrough and a distortion addition path for adding distortion connected in parallel between an unbalanced input terminal to which a high frequency signal is inputted and an unbalanced output terminal to which an object subjected to secondary distortion component compensation is connected, wherein the fundamental wave passing path includes an attenuation component for signal attenuation formed by resistors and a delay line connected in series with the attenuation component for coinciding arrival time of a signal passing through the distortion addition path with passing time of a fundamental wave passing through the fundamental wave passing path, wherein the distortion addition path is configured in a manner that a first attenuation element for signal attenuation formed by a resistor and first and second diodes for generating secondary distortion are connected in series between the unbalanced input terminal and ground, and that a second attenuation element for setting a signal level formed by a resistor is connected in series between the unbalanced output terminal and a connection point between the first diode and the second diode, and wherein the first and second diodes are connected to the connection point at their electrodes of same polarity, and magnitudes of DC bias currents supplied to the first and second diodes are set in a manner that, when the high frequency signal applied to the unbalanced input terminal reaches the connection point and are subjected to amplitude expansion and compression alternately in every half period of the high frequency signal, a voltage value expanded from the high frequency signal is equal to a voltage value compressed therefrom.

That is, according to the distortion compensation circuit of the present invention, in the system for generating the distortion component, unlike the conventional circuit, the secondary distortion is generated by using the combination of the diodes from the signal of the balanced state without converting the balanced state to the unbalanced state by using a transformer. Then, odd order distortion is prevented from being generated without using a transformer by setting the bias currents for the diodes to a predetermined condition. Further, as a means for distributing and mixing signals between the system for passing the fundamental wave component having no distortion and the system for adding distortion, only resistors are employed for the distribution and mixing in place of a directional coupler formed by a transformer. Thus, the distortion compensation circuit is formed only by the pure resistance components, the resistance components of the diodes having non-linear voltage-current characteristics, and the delay lines for coinciding the delay times between both the systems. As a result, since there is no element whose delay time changes depending on frequency, it is possible to generate reverse distortion component having accurate phase over a wide frequency band.

BRIEF DESCRIPTION OF DRAWINGS

FIG. 1A is a circuit diagram showing the configuration of the distortion compensation circuit and FIG. 1B is a waveform diagram showing the state where the secondary distortion is generated in the distortion compensation circuit;

DETAILED DESCRIPTION OF THE PREFERRED EMBODIMENTS

Figure 1A:
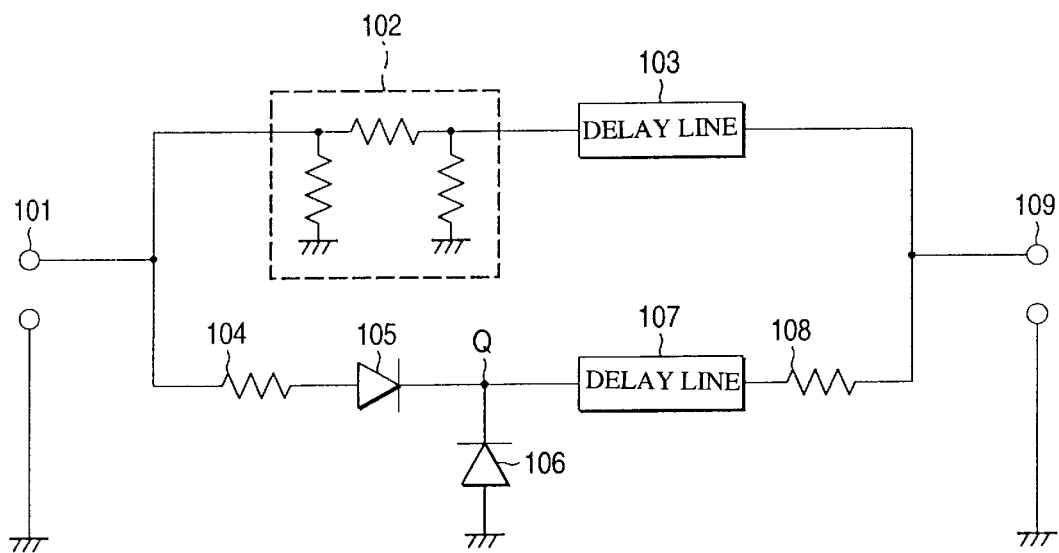
FIGS. 1A and 1B are diagrams showing the configuration and the operation of the distortion compensation circuit according to an embodiment of the present invention, more specifically.
Figure 1B:
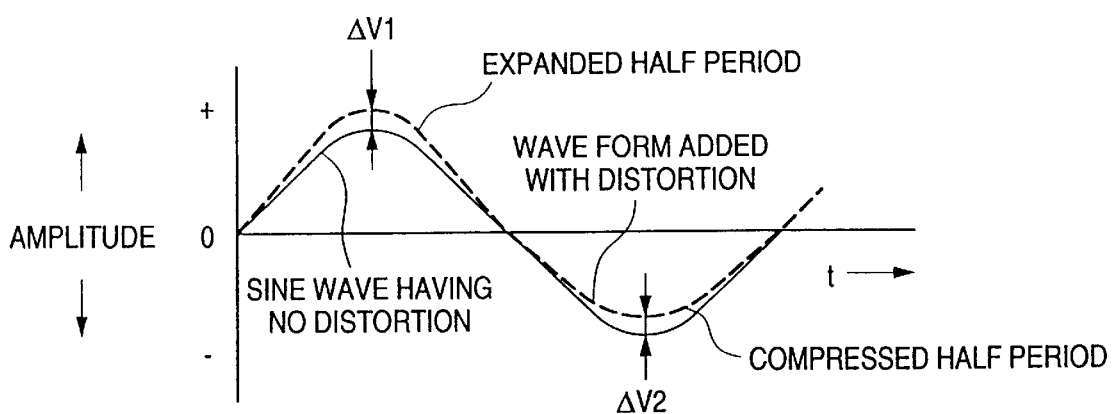
Figure 2:
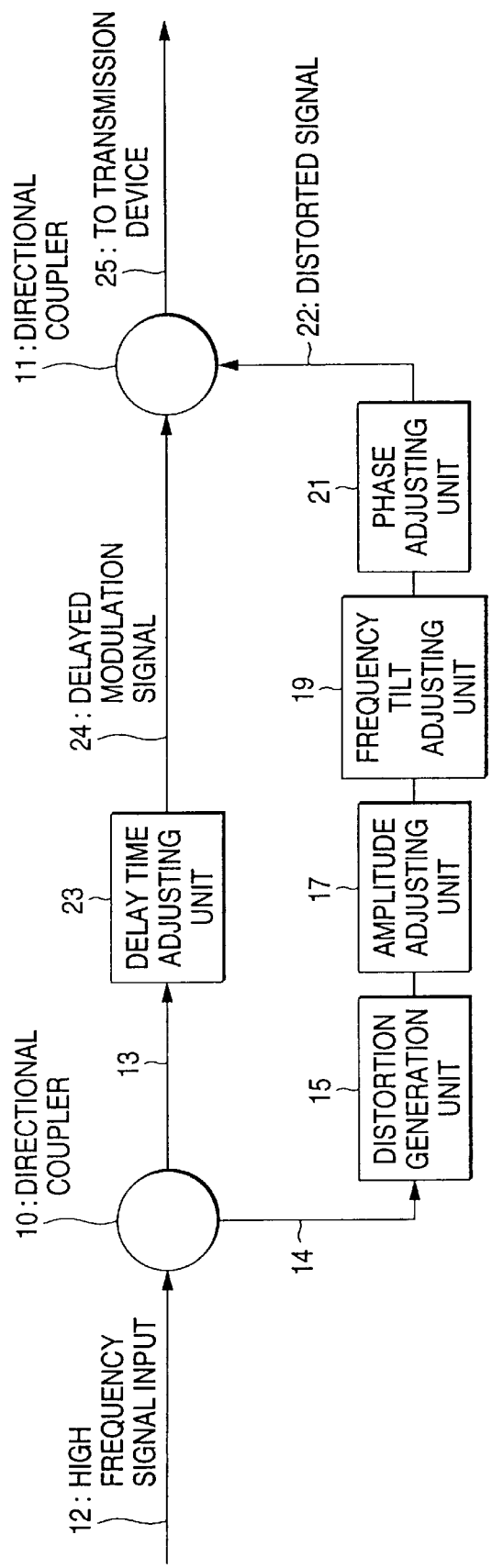
FIG. 2 is a block diagram showing the configuration of a conventional distortion compensation circuit.
Figure 3:
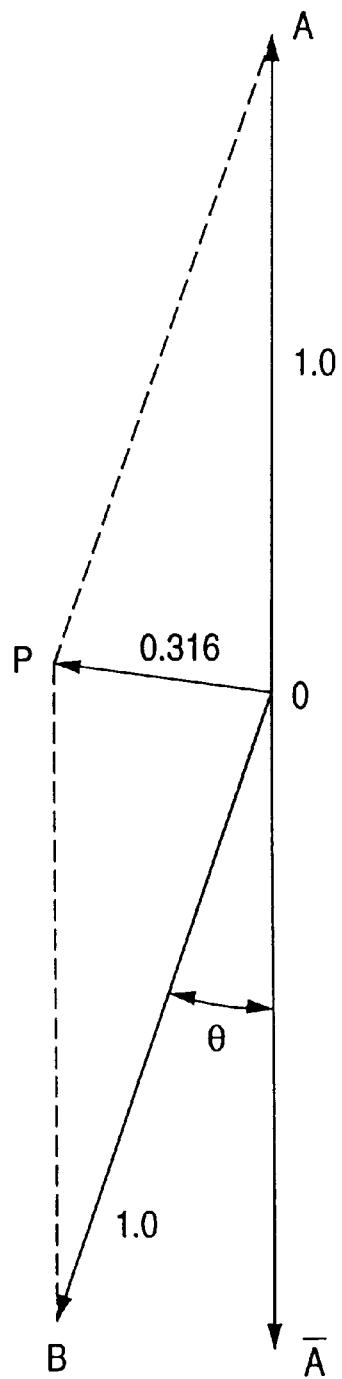
FIG. 3 is a vector diagram for explaining the required characteristics of a distortion compensation circuit.
Figure 4:
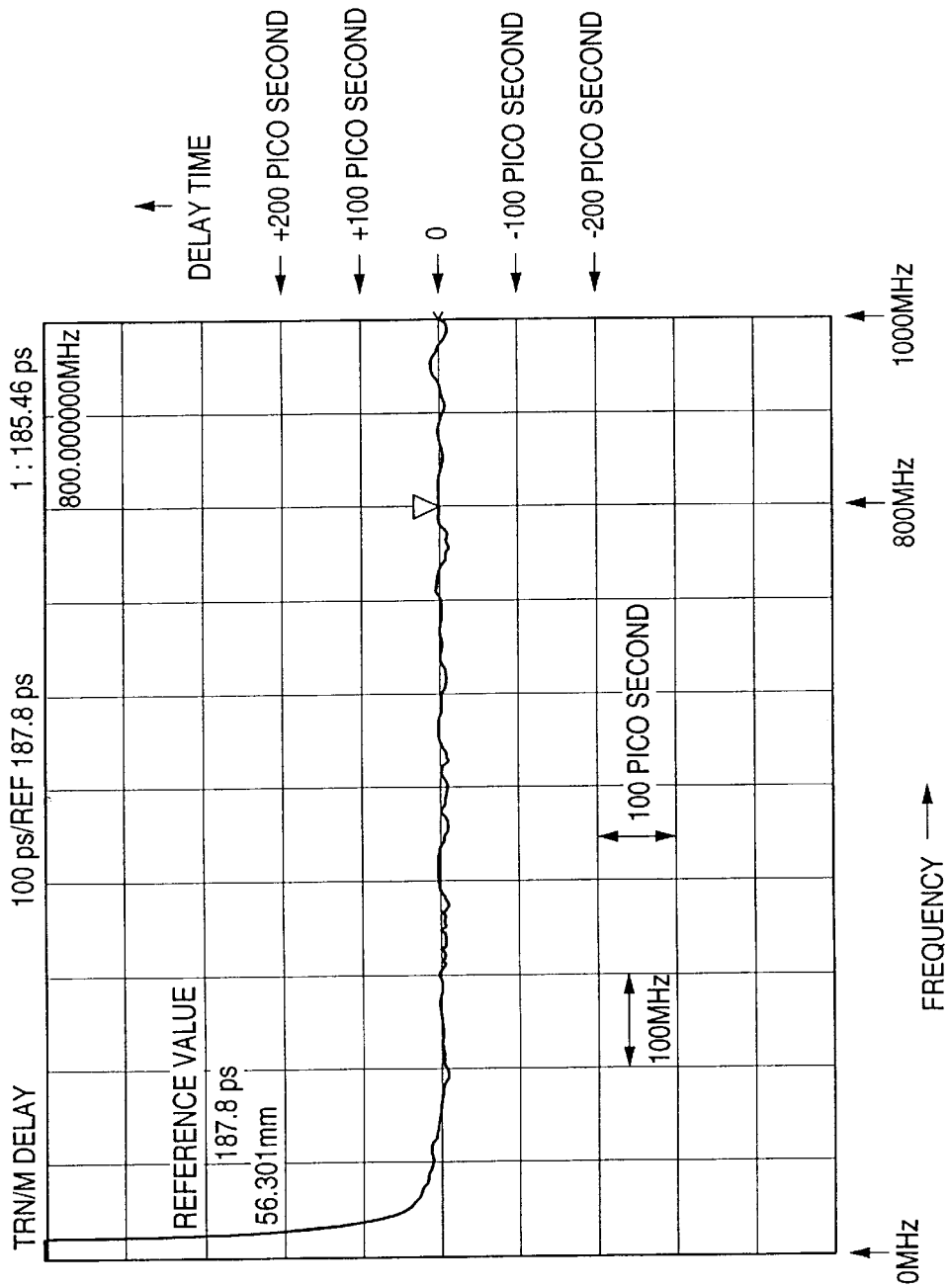
FIG. 4 is an example of measured results showing the delay time characteristics between the input and the output of a directional coupler 10 disposed between a high-frequency signal input 12 and an output 13 of the conventional distortion compensation circuit in FIG. 2.
Figure 5:
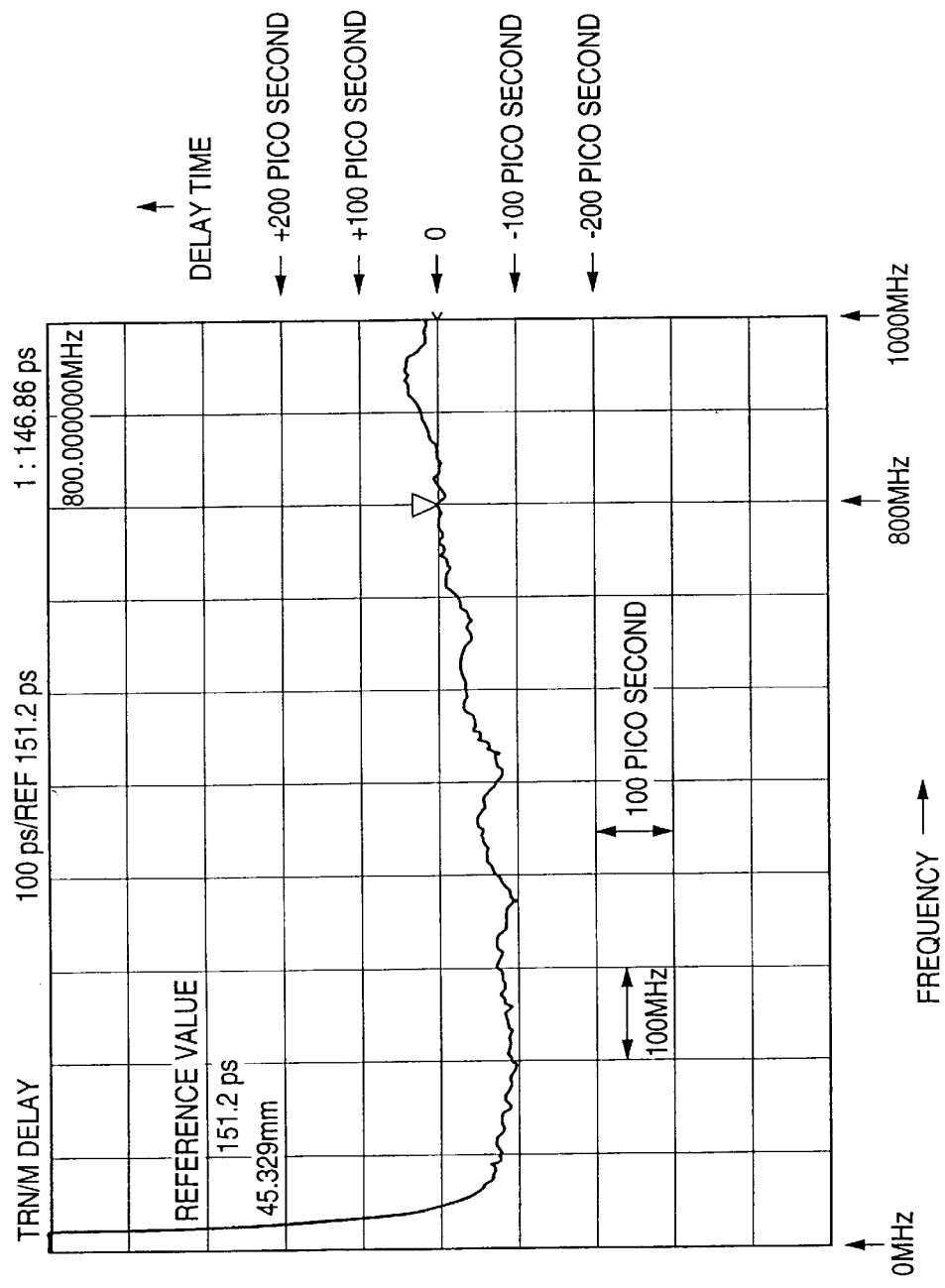
FIG. 5 is an example of measured results showing the delay time characteristics between the input terminal and the branched terminal of the directional coupler 10 disposed between the high-frequency signal input 12 and the branched terminal of the conventional distortion compensation circuit in FIG. 2.
Figure 6:
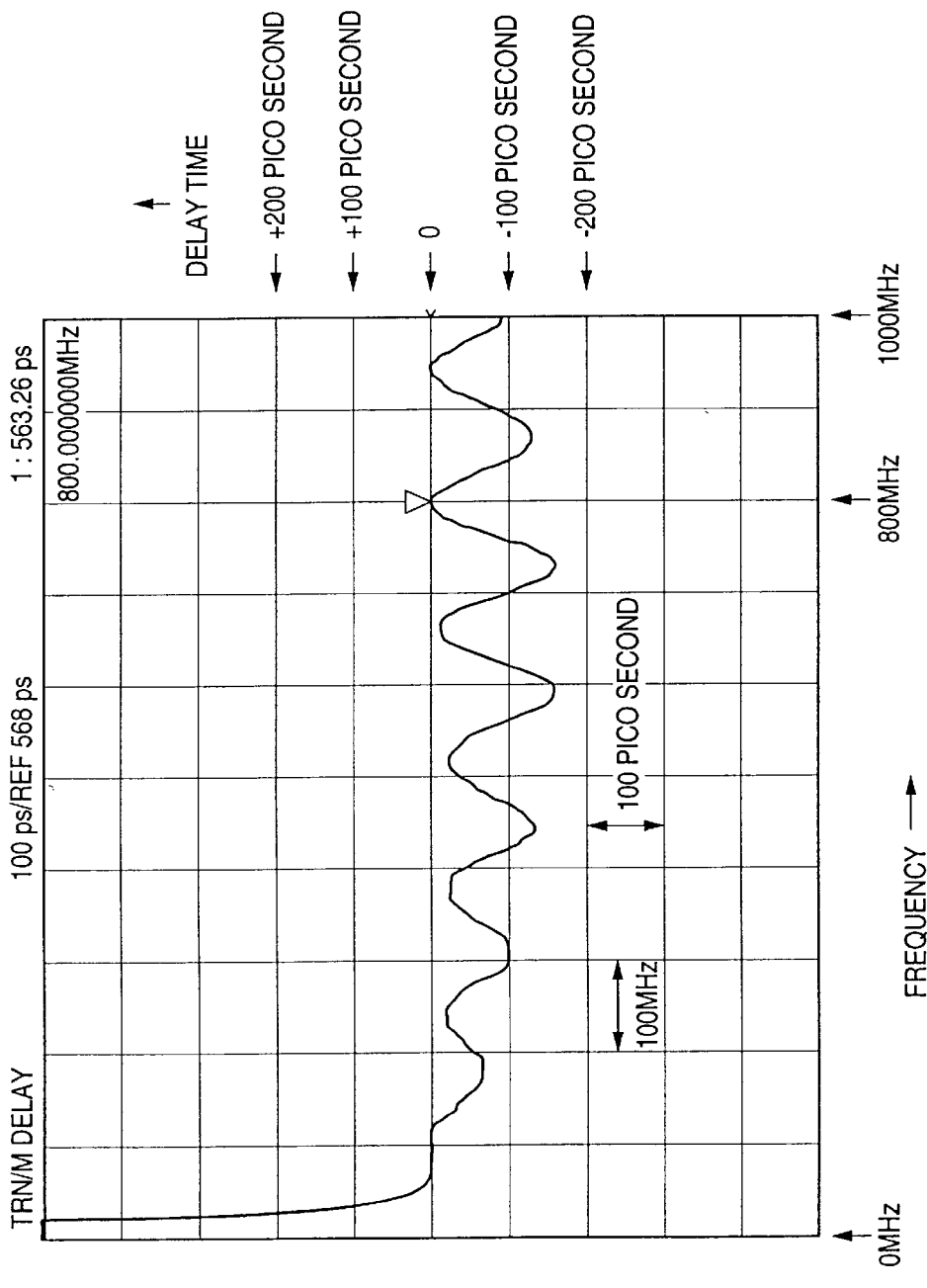
FIG. 6 is an example of measured results showing the delay time characteristics of a 180 degree splitter described in an odd order distortion generation circuit shown in FIG. 7 of the conventional distortion compensation circuit shown in FIG. 2.
Figure 7:
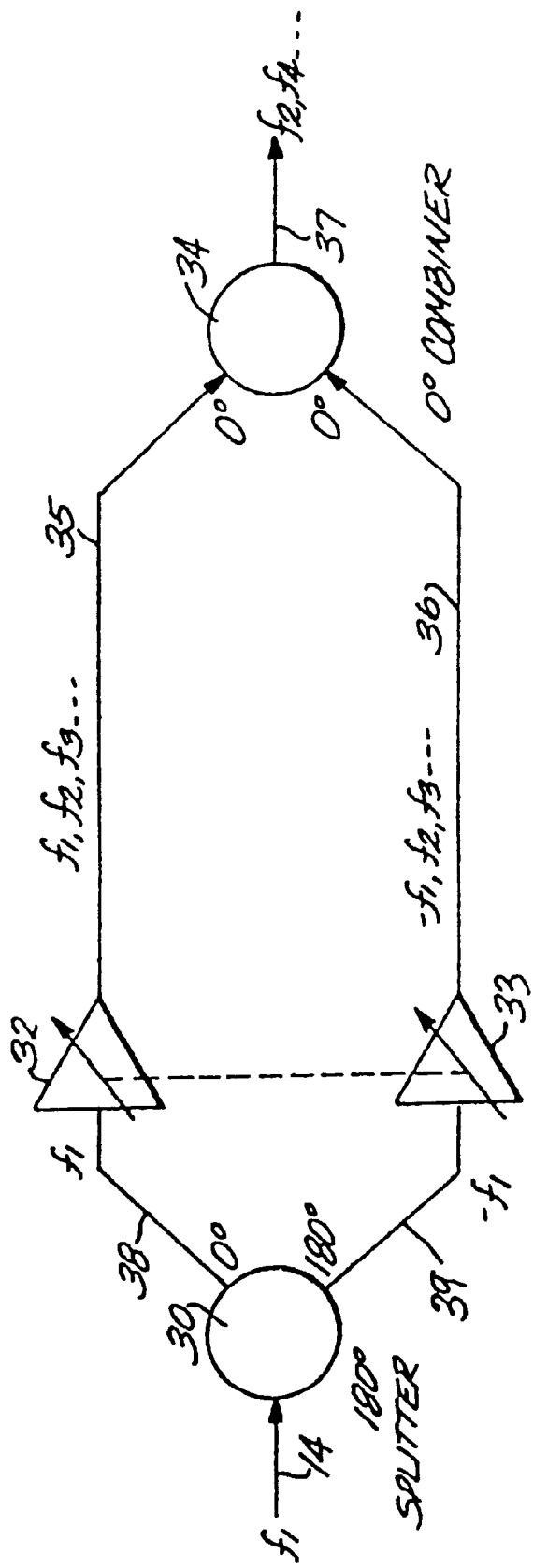
FIG. 7 is a block diagram of the distortion generation unit 15 of the conventional compensation circuit of FIG. 2.

Embodiments of the present invention will be described with reference to the accompanying drawings. FIGS. 1A and 1B are diagrams showing the configuration and the operation of the distortion compensation circuit according to an embodiment of the present invention. FIG. 1A is a circuit diagram showing the configuration of the distortion compensation circuit and FIG. 1B is a waveform diagram showing the state where the secondary distortion is generated in the distortion compensation circuit.

In this distortion compensation circuit, a signal flows toward an output terminal 109 from an input terminal 101. The output terminal 109 is connected to an element subjected to the distortion compensation, for example, a laser diode (LD).

The signal inputted into the input terminal 101 is branched into two signal paths. In one of the signal paths, the signal passes through an attenuation component 102 and a delay line 103, then outputted as a fundamental wave component having no distortion.

The attenuation component 102 is configured as a so-called π type attenuation circuit formed by combining three resistors. However, when the impedance matching is not required strictly, both or one of the resistors being grounded may be eliminated.

The other signal path is a system for adding a secondary distortion component. In this signal path, the signal suitably attenuated by a resistor 104 is supplied to diodes 105, 106 connected in opposite direction to each other. Although not shown in FIG. 1, the distortion compensation circuit is provided with a circuit for supplying DC bias current to the diodes 105, 106. This bias circuit can be realized easily by combining capacitors for cutting off a DC component, inductors for cutting off a high frequency component and resistors.

The signal including the secondary distortion component appears at the connection point Q between the diodes 105, 106. This signal passes through a delay line 107 and a resistor 108, which performs attenuation for setting the signal level, then mixed with the fundamental wave component at the output.

The state where the secondary distortion is generated by the two diodes 105, 106 will be explained with reference to FIG. 1B. This figure represents the waveform of the high frequency signal as to the time axis.

Supposing that the input signal inputted into the input terminal 101 is sine waveform and the diodes 105, 106 are replaced by a resistor having a resistance value equivalent to the diodes, a sine waveform similar to the input signal waveform and having no distortion appears at the connection point Q as shown by a waveform of a steady curve in FIG. 1B.

Next, supposing that the diodes 105, 106 operate in their original state representing the nonlinear voltage-current characteristics, the diode 105 is biased by a higher voltage to the forward direction in every positive half period of the sine wave and hence placed in a further conductive state. As a consequence, the current flowing into the connection point Q becomes larger than the case where the resistor is used in place of the diodes. That is, the amplitude of the signal at the connection point is expanded to the positive direction in the positive half period of the sine wave as shown by a broken curve in FIG. 1B. In the negative half period of the sine wave, the diode 106 is biased to the forward direction by a voltage higher than the no-signal state, so that the current flowing into the ground increases. As a result, the signal voltage at the connection point Q decreases and so the amplitude of the signal is compressed in the negative half period of the sine wave as compared with the original sine wave as shown by the broken curve in FIG. 1B.

In this manner, the waveform appearing at the connection point Q between the diodes 105, 106 is subjected to the amplitude expansion and compression alternately at every half period thereof. Therefore, this waveform is clearly a sine wave to which its square component, that is, secondary distortion component is added.

When the direction of each of the diodes 105, 106 in the distortion compensation circuit in FIG. 1A is reversed, the obtained result will be in opposite to the case shown in FIG. 1B. That is, the amplitude of the signal at the connection point will be compressed in the positive half period and expanded in the negative half period. Such an arrangement may be employed depending on the biasing condition of the laser diode (LD) serving as a load.

In the waveform shown in FIG. 1B, supposing that the voltage value expanded from the original sine wave is $\Delta V1$ at the positive maximum amplitude point thereof and the voltage value compressed from the original sine wave is $\Delta V2$ at the negative maximum amplitude point thereof, when a condition of $\Delta V1 = \Delta V2$ is satisfied, the waveform added with the distortion does not contain the third distortion component. Such a condition can be satisfied by setting the bias current of each of the diodes suitably. Further, when the currents flowing into both the diodes are increased or decreased while maintaining such a condition, the target amplitude of the distortion component optimum for canceling the secondary distortion can be obtained.

While, in the distortion compensation circuit shown in FIG. 1A, each of the diodes 105, 106 is shown by a circuit symbol representing a single element, each of the diodes may be replaced by a plurality of diodes connected in series depending on the required amount of distortion.

Further, in the distortion compensation circuit shown in FIG. 1A, the delay lines 103, 107 are disposed in the path for passing the fundamental wave component and the path for adding the distortion, respectively. The delay lines 103, 107 are provided in order to attain an object of coinciding the arrival times of the signals to the output having passed through both the paths. Accordingly, it is considered that this object can be attained even by eliminating one of the delay lines, in particular, the delay line 107 on the distortion generation side path which has larger number of the elements for passing the signal therethrough and hence seems to have a larger delay time. However, as described above, the fundamental wave component and the distortion component are required to be mixed with a time difference of about several picoseconds therebetween. In other words, when this time difference is converted in the electric length, this fact means that the error of only about 1 mm electric length is permitted. Accordingly, the sizes of parts and the line lengths of the circuit board can not be negligible.

Since the real electric length can not be made zero even if any kinds of parts are used and configured in any connection method, the description is made that the delay times of the delay lines 103, 107 include the delay times of the parts and connection boards or the like.

The attenuation component 102 of the distortion compensation circuit in FIG. 1A flows current to the distortion generation portion due to the voltage drop caused at both ends of the component. Since the CSO serving as the secondary distortion component to be canceled has generally a small level of about −60 dB or less, the above described voltage drop is required to be small. In other words, the loss of the fundamental wave component due to the attenuation component 102 is a small value of about 1 dB, so that the insertion loss of this circuit does not affect bad influence on the operation of the external unit.

According to the thus configured distortion compensation circuit, the fundamental wave passing path for passing the fundamental wave is configured by serially connecting the delay line 103 and the component 102 for signal attenuation which is formed by combining the resistors. Further, the distortion adding path for adding distortion is configured in a manner that the first attenuation element 104 for signal attenuation formed by a resistor and the first and second diodes 105, 106 for generating the secondary distortion are connected in series and that the delay element 107 and the second attenuation element 108 for setting a signal level formed by a resistor are connected in series between the output terminal 109 and the connection point Q between the first and second diodes 105, 106. Thus, since the constituent elements of the distortion compensation circuit includes only the pure resistance components, the resistance component of the diode having the nonlinear voltage-current characteristics and the delay lines for coinciding the delay times of both the paths, there is no element whose delay time changes depending on the frequency. Accordingly, the distortion compensation circuit can generate the reverse distortion component having accurate phase over a wide frequency band.

Further, according to the thus configured distortion compensation circuit, only the diodes 105, 106 require DC bias current as a power source and the value of the bias current is about 1 mA or less. Accordingly, unlike the conventional distortion compensation circuit, since the present invention does not employ a high-frequency amplifier consuming large current as an element for generating the distortion, it is possible to compensate the distortion with good efficiency.

Although, in the aforesaid embodiment, the explanation is made mainly as to the optical transmission laser diode (LD)

as an object subjected to the distortion compensation, the distortion compensation circuit according to the embodiment can be applied to the case for improving the secondary distortion characteristics of other elements or devices generating the secondary distortion, for example, a light emitting diode, a high-frequency amplifier not performing the push-pull operation, or the like.

As described above, according to the distortion compensation circuit of the present invention, in the system for generating the distortion component, the secondary distortion is generated by using the combination of the diodes from the signal of the balanced state without converting the balanced state to the unbalanced state by using a transformer. Then, odd order distortion is prevented from being generated without using a transformer by setting the bias currents for the diodes to a predetermined condition. Further, as a means for distributing and mixing a signal between the system for passing the fundamental wave component having no distortion and the system for adding distortion, only resistors are employed for the distribution and mixing in place of a directional coupler formed by a transformer. Thus, the distortion compensation circuit is formed only by the pure resistance components, the resistance components of the diodes having non-linear voltage-current characteristics, and the delay lines for coinciding the delay times between both the systems. As a result, since there is no element whose delay time changes depending on frequency, it is possible to generate reverse distortion component having accurate phase over a wide frequency band.

Accordingly, the present invention is able to improve the secondary distortion characteristics of the device, such as an optical transmitter or the like using a laser diode, which operates in a wide frequency band with quite simple configuration and without using a high-frequency transformer which causes the variation of delay time.

What is claimed is:

1. A distortion compensation circuit connected between an unbalanced input terminal to which a high frequency signal is inputted and an unbalanced output terminal to which an object subjected to secondary distortion component compensation is connected, the distortion compensation circuit comprising:

a fundamental wave passing path for passing a fundamental wave therethrough; and a distortion addition path for adding distortion, the distortion addition path being parallel to the fundamental wave passing path, wherein the fundamental wave passing path comprises an attenuation component circuit for signal attenuation formed by at least one resistor, and a delay line connected in series with the attenuation component circuit for coinciding arrival times at the unbalanced output terminal of a signal passing through the distortion addition path and a fundamental wave passing through the fundamental wave passing path, wherein the distortion addition path comprises a first attenuation circuit for signal attenuation comprising a resistor and first and second diodes for generating secondary distortion connected in series between the unbalanced input terminal and ground, and a second attenuation element for setting a signal level comprising a resistor connected in series between the unbalanced output terminal and a connection point between the first diode and the second diode, and wherein the first and second diodes are connected to the connection point at their electrodes of same polarity, and magnitudes of DC bias currents supplied to the first and second diodes are set in a manner that, when the high frequency signal applied to the unbalanced input terminal reaches the connection point and is subjected to amplitude expansion and compression alternately in every half period of the high frequency signal, a voltage value expanded from the high frequency signal is equal to a voltage value compressed therefrom.

2. A distortion compensation circuit comprising:

a fundamental passing path for passing a fundamental wave, the fundamental passing path comprising an attenuation component for attenuating a signal, and a first delay element connected in series to the attenuation component; and a distortion adding path for adding distortion, the distortion adding path being connected to the fundamental passing path in parallel, wherein the distortion adding path comprises a first attenuation component for attenuating a signal, a first diode and a second diode for generating distortion connected in series to the first attenuation component in series, a second delay element connected to the first and second diodes, and a second attenuation element for setting a signal level, wherein the second delay element and the second attenuation element are connected in series between a connection point of the first diode and the second diode and an output terminal.

3. The distortion compensation circuit according to claim 2, wherein the first and second diodes are connected to the connection point at their electrodes of same polarity, and magnitudes of DC bias currents supplied to the first and second diodes are set in a manner that, when the high frequency signal terminal reaches the connection point and is subjected to amplitude expansion and compression alternately in every half period of the high frequency signal, a voltage value expanded from the high frequency signal is equal to a voltage value compressed therefrom.

* * * * *